United States Patent [19]

Nelson

[11] 4,291,225
[45] Sep. 22, 1981

[54] MOLDED PLASTIC PHOTO-OPTICAL KEYBOARD

[75] Inventor: Edward I. Nelson, Sunrise, Fla.

[73] Assignee: Burroughs Corporation, Detroit, Mich.

[21] Appl. No.: 75,366

[22] Filed: Sep. 14, 1979

[51] Int. Cl.³ .............................................. G01D 5/34
[52] U.S. Cl. .................................................. 250/229
[58] Field of Search .............................. 250/221, 229;
235/145 R; 178/17 C, 17 D; 340/365 P, 365 R,
365 C, 365 L; 400/479, 491.3

[56] References Cited

U.S. PATENT DOCUMENTS

| | | | |
|---|---|---|---|
| 3,056,030 | 9/1962 | Kelchner | 400/479 |
| 3,648,050 | 3/1972 | Koo | 340/365 P |
| 3,796,880 | 3/1974 | Dorey | 340/365 P |
| 3,856,127 | 12/1974 | Halfon et al. | 250/221 |

Primary Examiner—David C. Nelms
Attorney, Agent, or Firm—David G. Rasmussen; Kevin R. Peterson; Edmund M. Chung

[57] ABSTRACT

The invention relates to a photo-optical keyboard having an improved keyboard housing and keys. The keyboard housing is a molded plastic piece having a matrix of apertures for keys and a series of light channels passing between the apertures. The light channels open up to the underside of the keyboard housing. A spacing below the keyboard housing allows the keys in the apertures to overtravel and obstruct the light paths. Light isolation barriers beneath the keyboard housing prevent crossover of light between channels. The key is a molded plastic key with vertical slots to allow for passage of light in the undepressed state.

18 Claims, 12 Drawing Figures

MOLDED PLASTIC PHOTO-OPTICAL KEYBOARD

BACKGROUND OF THE INVENTION

1. Field of the Invention

The invention relates to photo-optical keyboards. More specifically, the invention relates to an improved keyboard housing and keys for a photo-optical keyboard.

2. Description of the Prior Art

A photo-optical keyboard has a matrix of rows and columns of keys. The keyboard further has a matrix of optical paths (i.e. light channels) with a light channel for each row and each column. A light source is placed at one end of each light channel and a photo-receptor at the other end. When a key is depressed the light is blocked in the respective light channels for the row and column of the key. Decoding logic will determine which key in the matrix is depressed. The basic principles for photo-optical keyboards are shown in U.S. Pat. No. 3,056,030.

Up to this time, no commercial systems have been marketed because of the cost associated with overcoming design and manufacturing problems. Some prior art photo-optical keyboards (U.S. Pat. No. 3,856,127) have attempted to put the light channels for the columns and rows in different planes so they do not intersect. This requires that the holes either be drilled in the plastic keyboard or that the keyboard be molded in three pieces. Drilling is expensive and problems of the drill "walking" are present in attempting to drill holes at an angle for a diagonal matrix. Molding the keyboard in three pieces introduces alignment problems because of warpage and shrinkage in molded plastics.

U.S. Pat. No. 3,796,880 shows an assembly with the light channels formed by sandwiching two plates together. A portion of each of the channels is in each plate. If molded plastic pieces are used, alignment, shrinkage and warpage problems occur at the interface of the plates. This could prevent the keys from moving easily and could also cause light leakage between light channels thus producing false signals.

SUMMARY OF THE INVENTION

The present invention provides a keyboard assembly that overcomes the problems of the prior art and reduces manufacturing costs. The present invention is an improved photo-optical keyboard having a single piece molded housing having a matrix of rows and columns of apertures for keys. The underside surface of the housing has a light channel for each row which runs between the apertures for each row. There is further a light channel for each column passing between the apertures for each column. The light channels open up to the underside surface of the molded housing.

The invention further may contain light isolation barriers which are beneath the keyboard housing between the rows of light channels. These light isolation barriers prevent crossover of light between channels. The light isolation barriers may be part of the keyboard housing and extend down from it. They may also be part of a baseplate which is spaced beneath the keyboard housing. The light isolation barriers would extend upward from the baseplate. If a baseplate is used light isolation barrier channels in the underside surface of the keyboard housing may be used.

The invention further may contain multiple keys each of which has vertical slots in the sidewalls opening up to the bottom of the key. When a key is placed in an aperture of the keyboard housing the vertical slots are adjacent to the light channels and allow light to pass if the key is not depressed. When the key is depressed light is blocked. The keys overlap the vertical edges of the light channels of the keyboard housing. This is accomplished by spacing the light channels in from the edges of the key apertures. In addition, the keys will overtravel the light channels.

One novel feature of the invention is the molding of the light channels in the bottom surface of the keyboard housing. This allows the keyboard housing to be molded as one plastic piece thereby reducing cost and eliminating problems of warpage, shrinkage, and alignment.

A second novel feature is the allowance of space beneath the keyboard housing. The spacing effectively puts the light channels up in the air and allows a key to overtravel during depression and pass beyond the light channel. Any buildup of debris will not prevent the key from being fully depressed, or effectively block the light passageway.

A third novel feature is the use of light isolation barriers to prevent crossover of light between light channels.

A fourth novel feature is the vertical slot in the key. The vertical slot allows the keystem and keytop to be molded in one operation thereby reducing cost. In addition, the slot is easily adapted to allow for a predetermined amount of free travel in the key to allow an operator to keep fingers on the keys with a light pressure without causing registration of a depression.

A fifth novel feature is the positioning of the light channels of the keyboard housing in from the edges of the key apertures. This allows the keys to overlap the vertical edges of the light channels and prevent leakage of light.

DETAILED DESCRIPTION OF THE PREFERRED EMBODIMENT(S)

Figure 1:
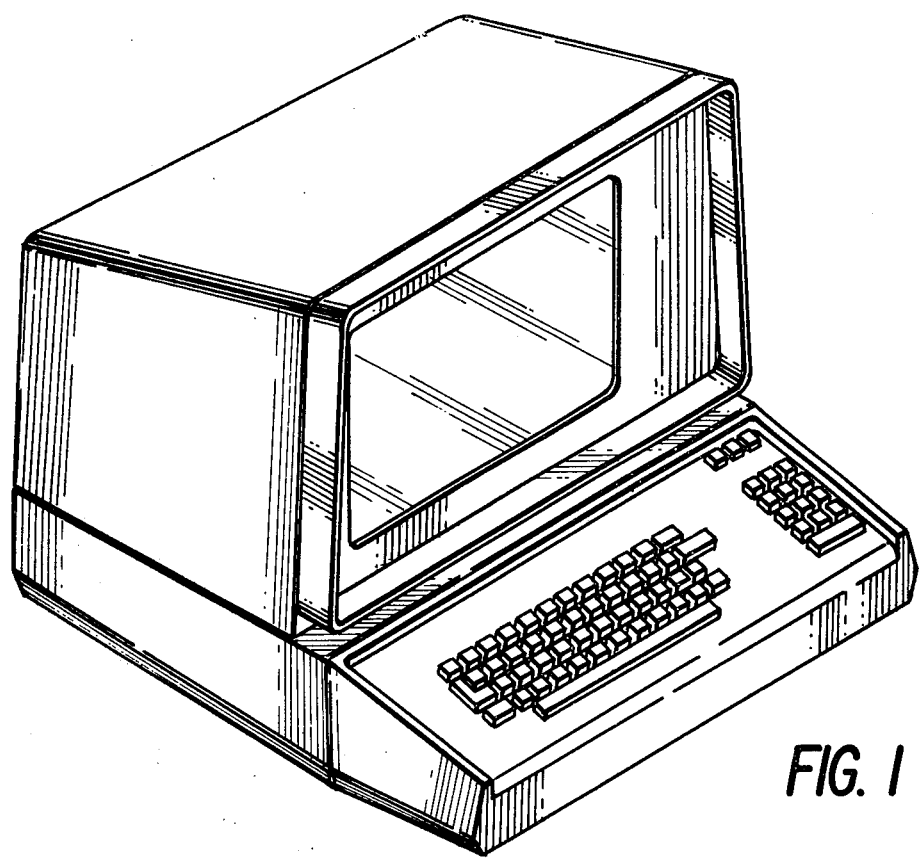
FIG. 1 is a perspective view of a CRT display terminal having a photo-optical keyboard.

FIG. 1 shows a typical operator terminal for a computer, word processor, or like type system. The terminal may, for example, have the characteristics of a typewriter and a calculator. The keys may be in a rectangular matrix as calculator keys or in a diagonal (offset) matrix as typewriter keys. All of the keys are located on one keyboard which has an excess capacity of key locations and is easily expandable. To add other keys to the keyboard the only change that need be made is the insertion of the additional keys and changing of the faceplate to one with more key positions.

Figure 2:
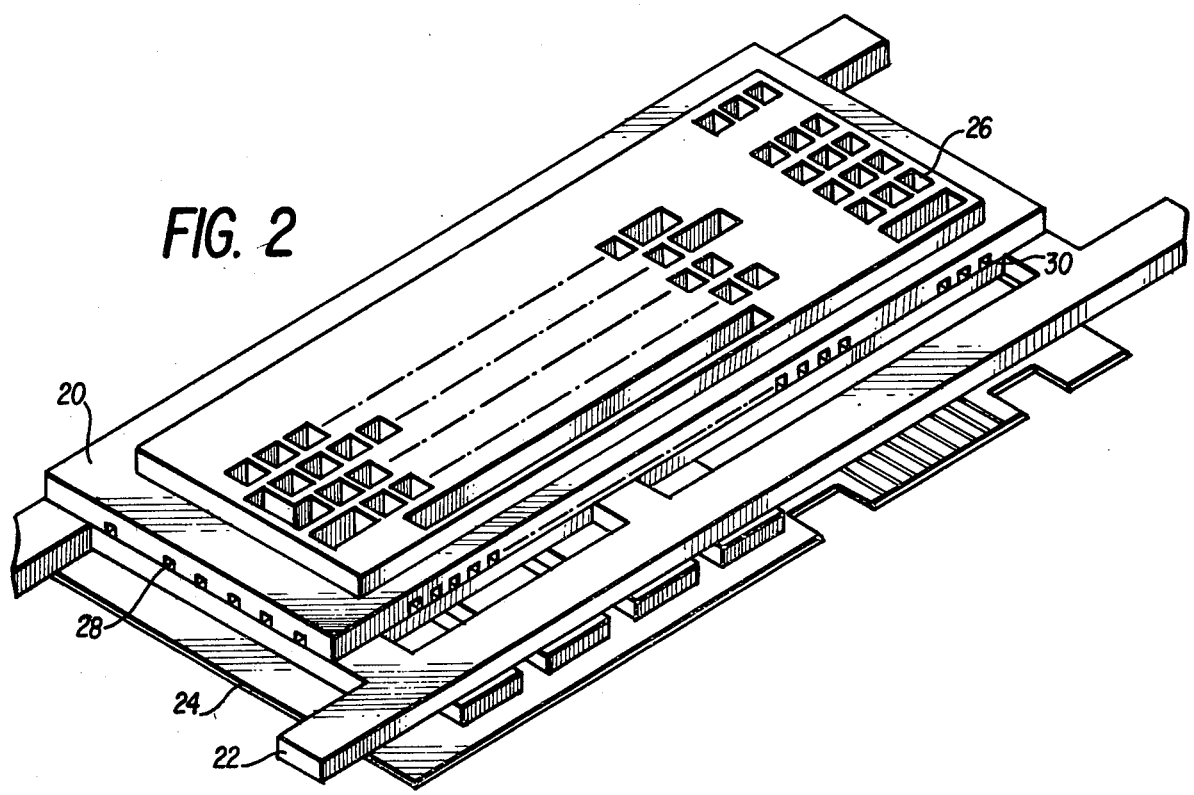
FIG. 2 is a perspective view of the photo-optical keyboard assembly of FIG. 1 having keys, faceplate and CRT display removed.

FIG. 2 shows the keyboard of FIG. 1 with the faceplate and keys removed. The keyboard consists of a keyboard housing 20, a base plate 22 and a printed circuit board 24. Printed circuit board 24 is attached to the underside of the baseplate 22 by appropriate fasteners (not shown).

Keyboard housing 20 has rectangular apertures 26 into which keys will fit. Only a few apertures are shown for illustration purposes, however, normally the whole raised portion of the keyboard housing will be taken up with apertures. At the base of the keyboard are shown optical passages or light channels. Light channels 28 extend along one axis and light channels 30 extend along the other axis. Light channels 28, 30 are entirely in the keyboard housing 20. Light channels 28 extend between all of the key apertures in each row. Light channels 30 extend between all of the apertures in each column. An illumination source such as a light, light emitting diode, or fiber optic bundle is placed at one end of light channels 28, 30 and photoreceptors are placed at the other end. These are not shown.

A printed circuit board subassembly 24 contains all of the decoding and electronic circuitry necessary for the keyboard. This all may be done with conventional circuitry.

Figure 3:
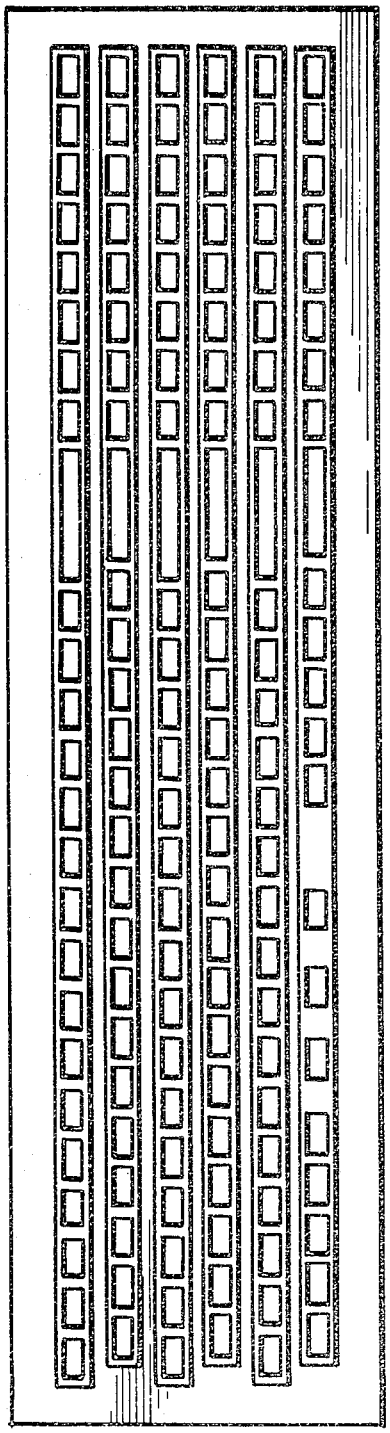
FIG. 3 is a plan view of a keyboard housing having key apertures in a rectangular matrix and a diagonal matrix.

FIG. 3 shows a more detailed top view of the key arrangement on the keyboard housing 20 of FIG. 2. The leftmost group of keys are in a diagonal matrix typical for a typewriter keyboard. The group of keys on the right are in a rectangular matrix typical of calculator keys.

Figure 4:
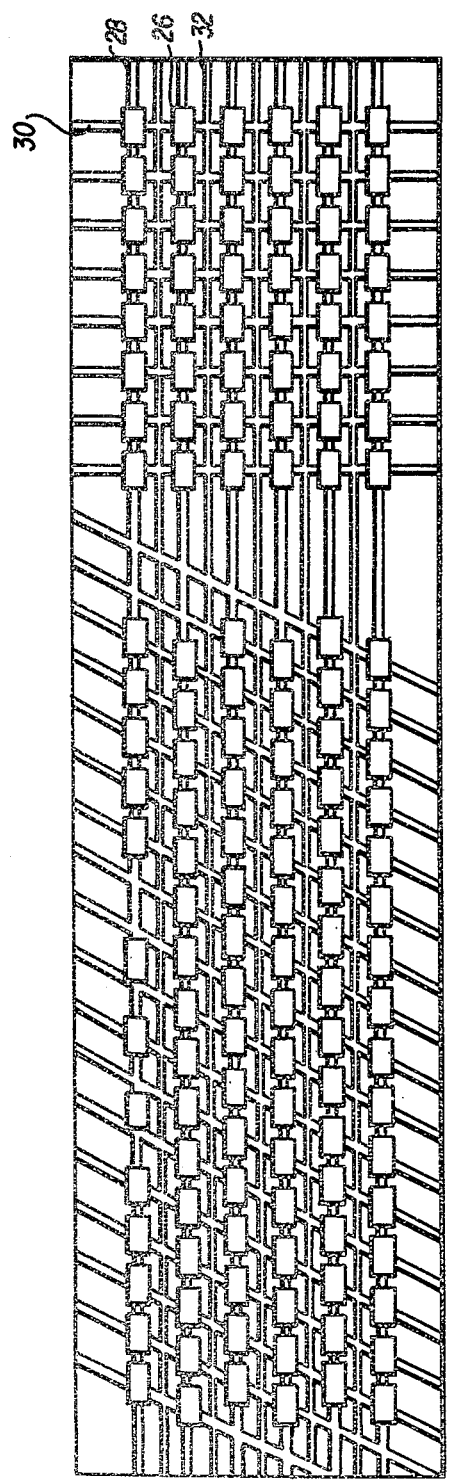
FIG. 4 is a bottom view of the keyboard housing of FIG. 3 showing light channels for both the diagonal matrix and the rectangular matrix.

FIG. 4 shows a bottom view of the keyboard housing of FIG. 2. The bottoms of apertures 26 are open, in both the diagonal and rectangular matrixes, to light channels 28, 30 for the rows and columns respectively. Between each of the rows are light isolation barrier channels 32 which are molded into the bottom of keyboard housing 20.

Figure 5:
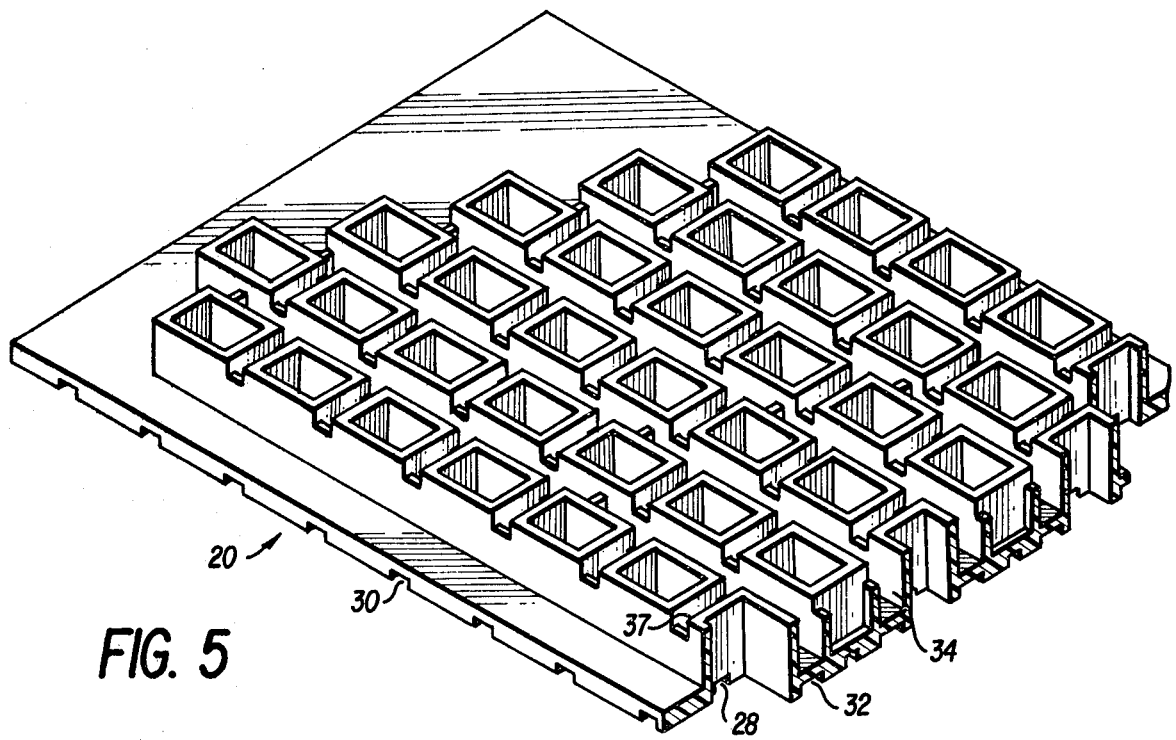
FIG. 5 is a perspective partial sectional view of the diagonal matrix portion of the keyboard housing of FIG. 3.

FIG. 5 shows a sectional view of keyboard housing 20. Light channels 28, 30 are illustrated at the bottom of the keyboard housing. These channels may be of the order of 3/32 inch in depth. Likewise, light isolation barrier channels 32 are at the bottom of the keyboard housing. Between rows of apertures 26 are recesses 34 and structural members 36. The structural members are below the top surface of the keyboard housing. It should be noted however, that light channels 28, 30 can be located along the top of the keyboard housing. Between the columns are recesses 37.

Figure 6:
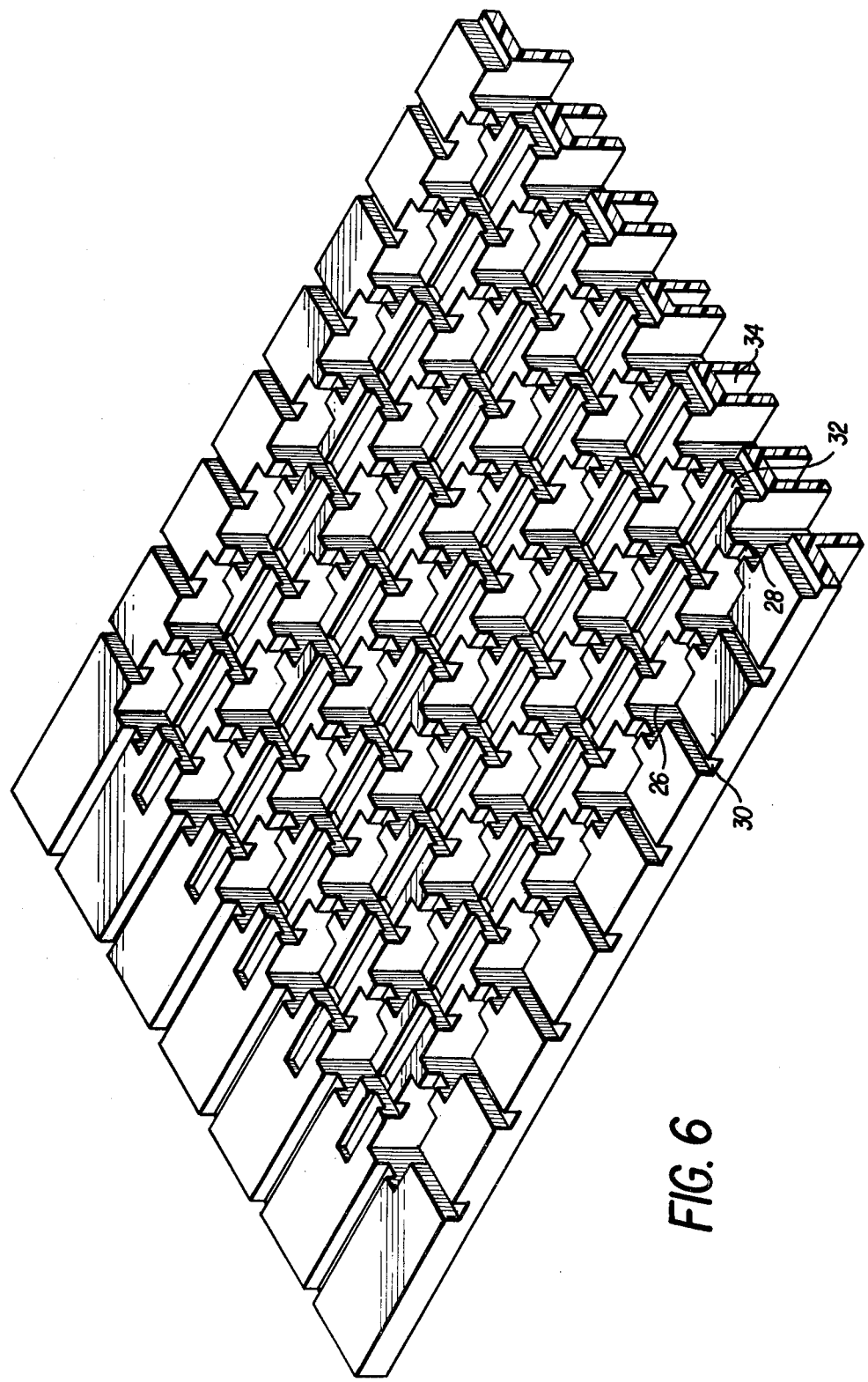
FIG. 6 is a perspective partial sectional view of the bottom of the rectangular matrix portion of the keyboard housing of FIG. 4.

FIG. 6 shows a sectional view of the bottom of the keyboard housing. Light channels 28, 30 passing between apertures 26 are open to the bottom of the keyboard housing. Likewise, light isolation barrier channels 32 are open to the bottom of the keyboard housing. Recesses 34 are also shown. The light channels, light isolation barrier channels, and aperture orientation allow the keyboard housing to be molded from plastic as a single unit in one molding operation. Secondary machining operations are, therefore, not required.

Light channels 28, 30 are set in from the edges of the apertures. This allows the key when depressed to overlap both sides of the light channel. This prevents light leakage along the sides of a key when the key is depressed. If the light channels were placed exactly even with the edges of the key apertures, normal clearance between the key and housing would allow light to leak between the surface of the key and the surface of the key aperture. As the key became worn the problem would be further aggravated. By setting the light channels in a minimum of 1/32 of an inch the key will completely overlap the light channel and prevent leakage. In the figure the light channels are shown in the middle of the apertures, overlapped by more than 1/32 of an inch.

Figure 7:
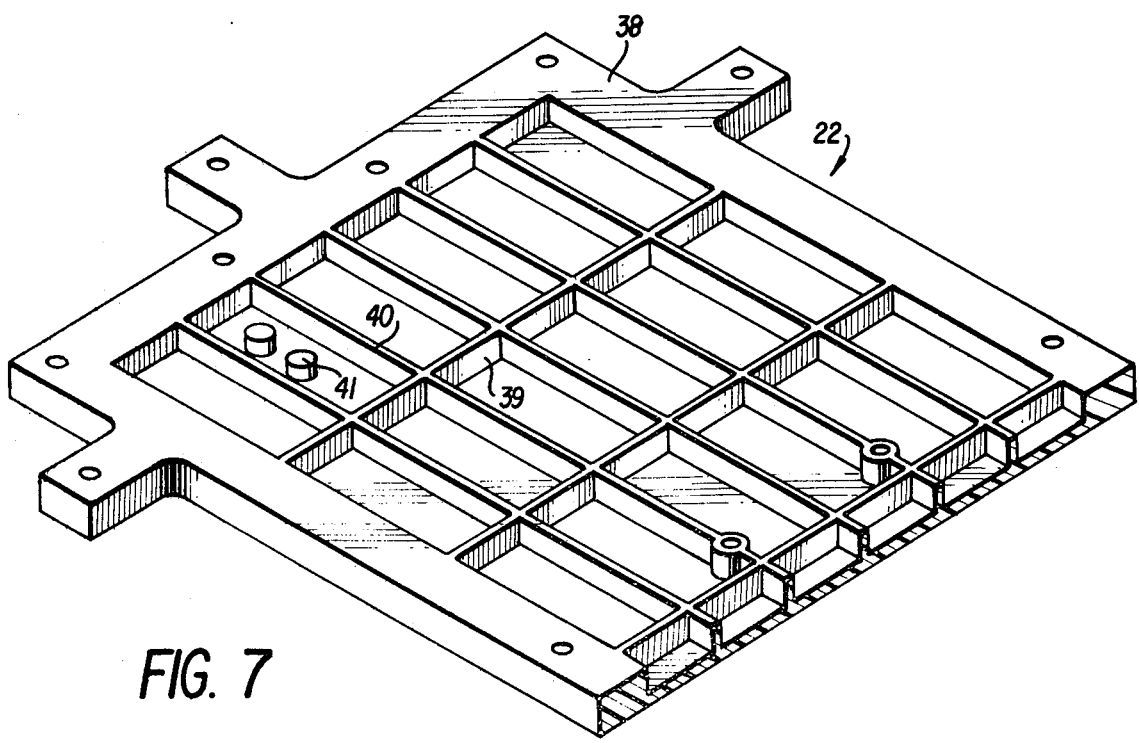
FIG. 7 is a perspective partial sectional view of the baseplate of the keyboard assembly of FIG. 2.

FIG. 7 shows baseplate 22 of the keyboard. The outer edge 38 will fit flush to the bottom of keyboard housing 20. The inner portion of base plate 22 is recessed with light isolation barrier 40 (i.e. ribs) running in the direction of the rows. Structural supports 39 run in the direction of the columns. The light isolation barriers 40 are intended to fit up into light isolation channels 32 (shown in FIG. 6). The light isolation barriers are required to prevent divergent light from one row from impinging on a photoreceptor for another row. The rows are long, of the order of 20 inches, and light divergence is large, therefore, the light isolation barriers are needed. On the other hand, the columns are short, of the order of 4 inches, and divergence is smaller so the barriers are not needed. The ribs have been positioned at intervals of two or three columns only for strength. Projections 41 are spring retainers which are placed at a location below each aperture 26 of the keyboard (only two are shown). The structure of baseplate 22 may be plastic molded in a one-shot molding operation.

Figure 8:
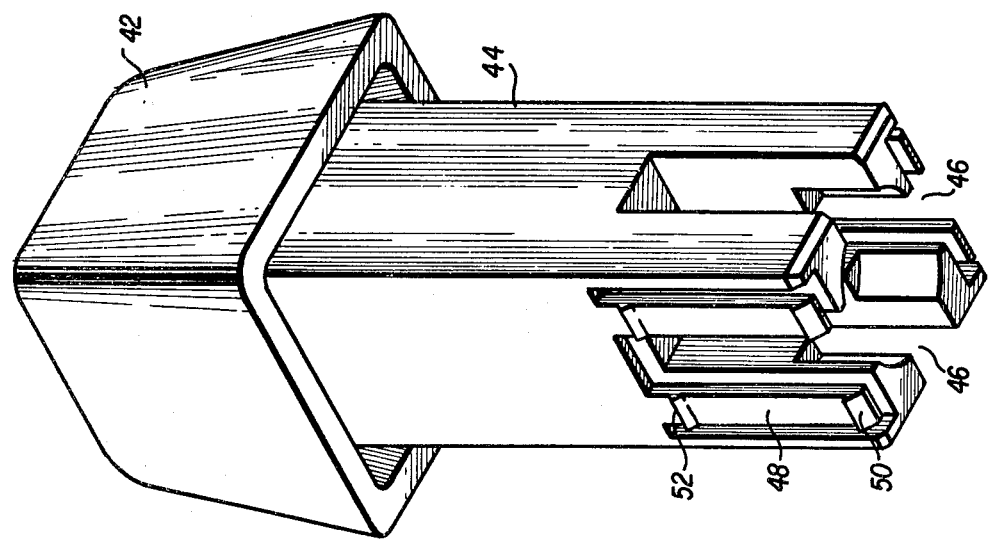
FIG. 8 is a perspective view of a key used in the keyboard assembly of FIG. 2.

FIG. 8 shows a key for use in the keyboard housing 20. The key as an umbrella shaped head 42 and a large rectangular keystem 44. The key has slots 46 which are open at the bottom of the key. The inner portion of the key is cut away to allow the key to fit over spring retainer 41 of baseplate 22. At two edges of the key are flexible fingers 48. At the bottom of each flexible finger is a small flange 50. Also on each flexible finger is a small ridge 52. The way light slots 46 are constructed, being open at the bottom, makes the key well suited for being molded in a one-piece process. The key is made of a high wear material such as acetal plastic. An example is Delrin, a trademark product of DuPont Company. Keys may also be made in two pieces to optimize wear on the stem and to allow color combinations on the keytop. For example, a high wear black keystem may have a red top having white letters.

Figure 9:
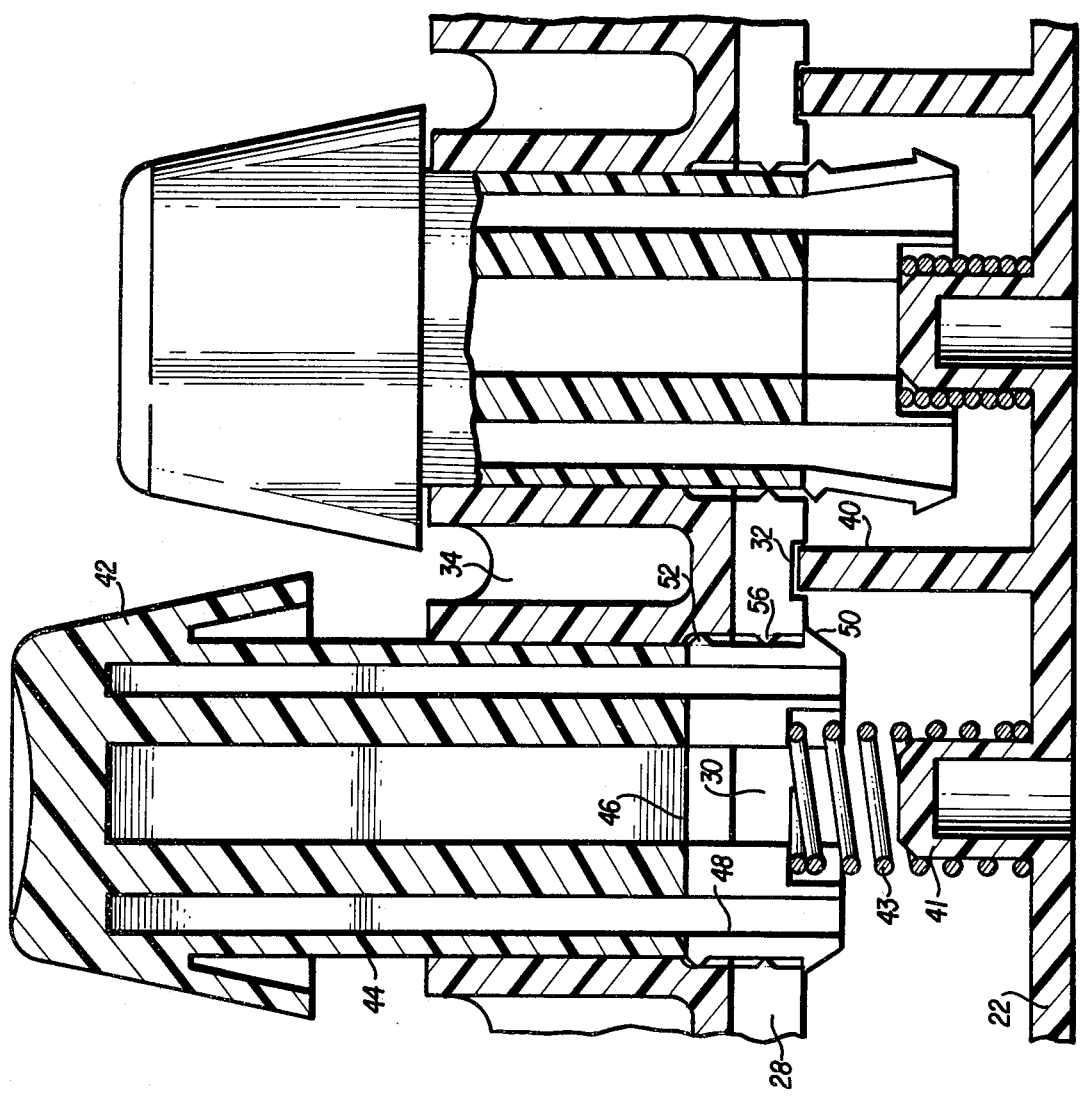
FIG. 9 is a sectional view of the keys shown in FIG. 8.

FIG. 9 shows a sectional view of the key of FIG. 8 in place in keyboard housing 20. The head of the key 42 extends over recess 34 (and 37 not shown). This allows any liquid spills on the keyboard to be trapped in recess 34 (and 37) rather than draining into the keyboard housing. Keystem 44 extends through aperture 26. The interior surface of aperture 26 has ridges 56. These ridges are meant to contact ridges 52 on flexible fingers 48 of the key to provide a tactile feel to the key when it is depressed. The flexible fingers allow the ridges to pass after contact is made. The exact pressure needed for the tactile feel may be predetermined by controlling the amount of interference between the two ridges and the angle of slope. A shallow angle offers a smooth action on depression while a step like shape on the ridges would provide very high resistance to continuing the key depression. An angle of about 30 degrees appears to offer a smooth operation.

At the end of flexible fingers 48 are flanges 50 which catch on the bottom surface of keyboard housing 20 and serve as stops to prevent the key from coming out of aperture 26. The flexibility of finger 48 allows the keys to be withdrawn easily for replacement. When the key is withdrawn the withdrawal force is much more than provided by the return spring and will cause fingers 48 to flex inward and allow the key to come out.

Row light channel 28 is shown extending from left to right across FIG. 9. Column light channel 30 comes out of the drawing and is in the same plane as light channel 28. Slot 46 is molded so that a portiion of the opening is above light channel 30. This allows for a small amount of free travel of the key, about 3/32 of an inch, before a key depression is registered. The remaining 3/32 travel of the key is for actuation. An operator may keep fingers on the keys with a slight pressure even when not intending to depress the key.

Spring retainers 41 are raised projections from baseplate 22. These spring retainers prevent slippage and buckling of spring 43. Umbrella cap 42 contacts keyboard housing 20 and prevents keystem 44 from being depressed all the way to the bottom of baseplate 22 (shown in depressed key at right). Light isolation barriers 40 extend up into light isolation barrier channels 32.

Figure 10:
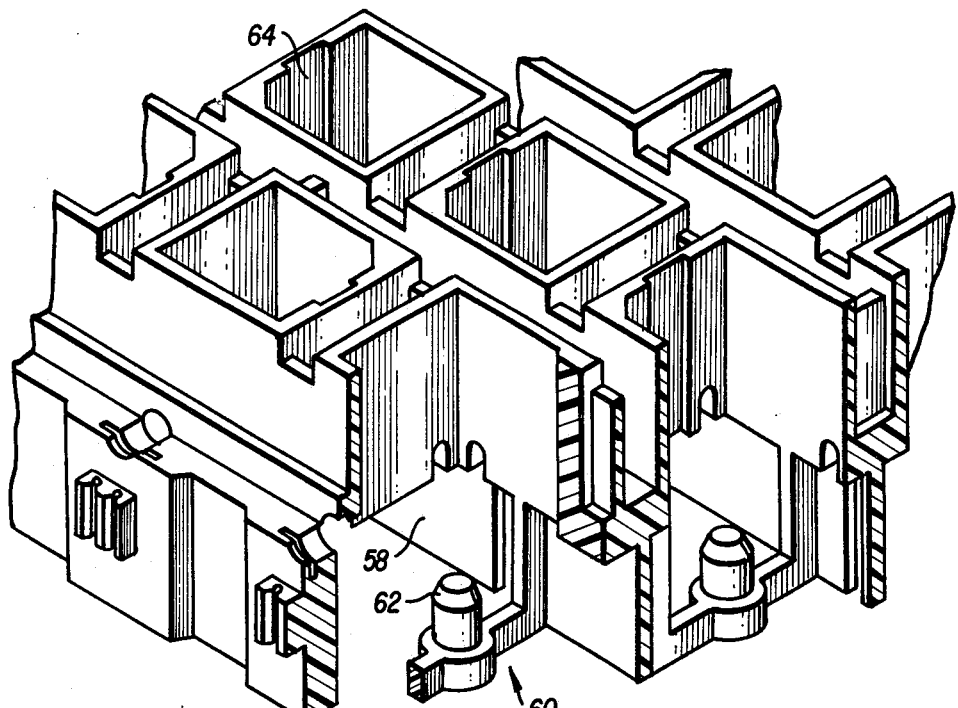
FIG. 10 is a perspective partial sectional view of an alternative keyboard housing.

An alternative embodiment to the apparatus shown in FIGS. 1-9 is shown in FIG. 10. This embodiment is simpler in structure and is preferred under some circumstances. In this embodiment light isolation barriers 58 extend downward from keyboard housing 60. This is in contrast to the previous embodiment where the light isolation barriers 40 extend up from baseplate 22 (shown in FIG. 9). By molding light isolation barriers 58 as part of the keyboard housing 60 the need for a baseplate is eliminated. The spring retainers 41 of baseplate 22 (FIG. 9) are replaced by spring retainers 62 which are supported by a structural member between the light isolation barriers 58. In addition channels 64 for the inclusion of tactile ridges have been added. A tactile ridge is in each channel near the bottom of the key apertures.

Figure 11:
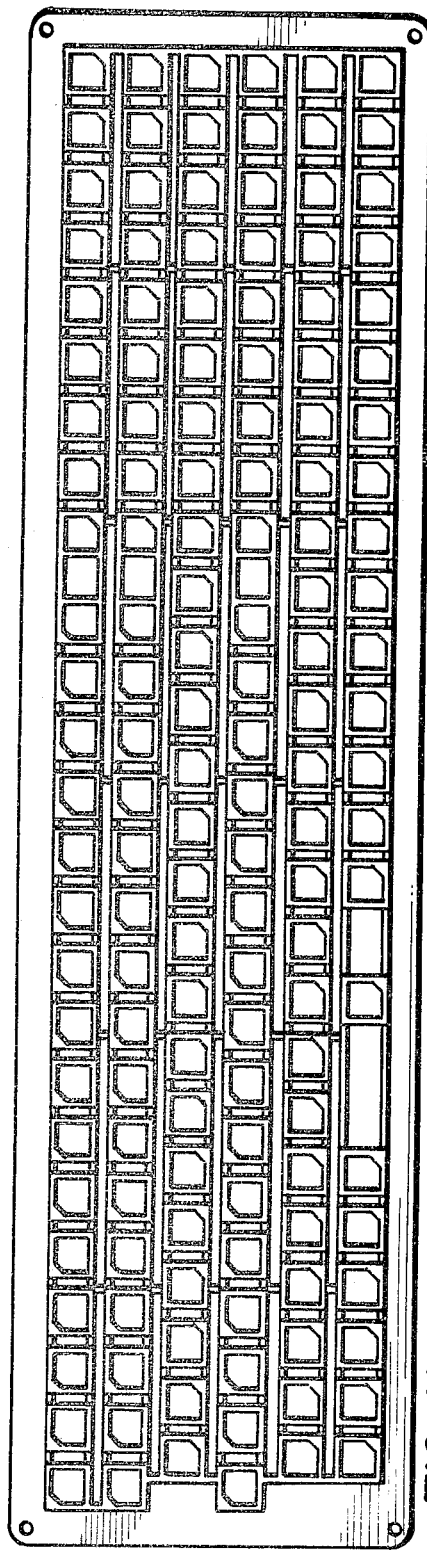
FIG. 11 is a plan view of a second alternative keyboard housing.
Figure 12:
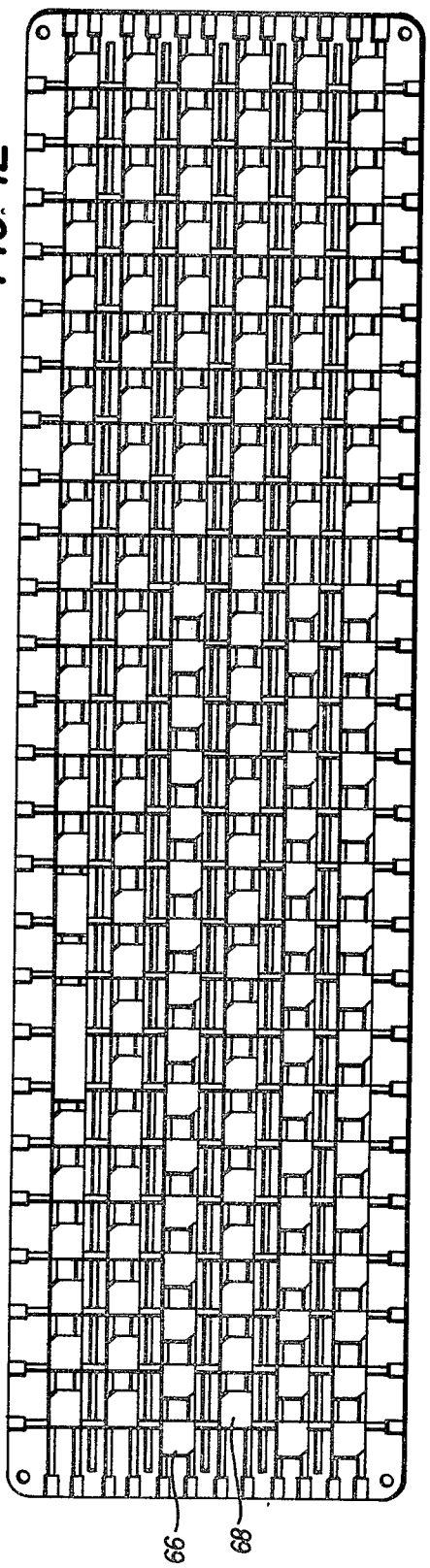
FIG. 12 is a bottom view of the keyboard housing of FIG. 11.

The preferred embodiment of the invention is shown in FIGS. 11 and 12. This embodiment shows an alternative way of arranging the light channels and key apertures that are shown in FIGS. 3 and 4. In FIGS. 11 and 12 the light channels are all in a rectangular matrix. A staggered arrangement for keys may be accomplished by placing the key apertures on alternate sides of a light channel as is shown by key apertures 66, 68 of FIG. 13. This simplifies the design of the molds needed to produce the keyboard housing. Furthermore the same key can be used in either key aperture 66 or 68. The key need only be turned 180° to fit one or the other. The structure of the keyboard shown in FIG. 10 may be used for the keyboard layout of FIGS. 11, 12.

In operation, the photo-optical keyboard generally operates the same as prior art optical keyboards. The principles are the same and the circuitry and decoding logic may be of a conventional type. What differs about the present invention is simplification of the keyboard to substantially reduce manufacturing costs and to improve the operation to overcome the problems of the prior art.

One advance in the present keyboard is that the keyboard housing is designed so that it may be a plastic piece molded in a single operation. This is possible because the light channels 28, 30 and light isolation channels 32 are open to the bottom surface of the keyboard housing.

In a molding process the molds can be separated (parted) in only one direction. The apertures in the keyboard housing are open along one axis. If holes were used for light channels, as in the prior art, the holes would be open along an axis perpendicular to the key apertures. Both the holes and apertures could not be molded in one operation. However, with the light channels open to the bottom surface the axis of the opening is the same as that of the key apertures and molding may be done in a single operation.

The prior art shows fabrication of light channels which are holes by using two adjacent pieces each one containing half of the hole. This has the drawback that if two molded pieces are used both are subject to warpage, differential shrinkage and alignment problems. The warping causes light leakage between light channels since the surfaces will not lay flat against each other. The alignment or shrinkage may cause the keys to hang up.

The present one-piece molded keyboard housing does not have either the warpage or alignment problem. The apertures for the keys are all in one molded piece and there can be no misalignment. Secondly, any warpage in the keyboard housing causes no problem because light isolation barriers prevent any crossover of light and compensate for any warpage. This is true for both the embodiment shown in FIGS. 1-9 and the embodiment shown in FIG. 10. The light isolation barriers are considered a second advance in the keyboard.

Another advance in the present keyboard is the allowance of overtravel by the keys. The overtravel overcomes the problem in prior art systems of a debris buildup in the light channels. In the prior art when the key is depressed it stops at the bottom of the light channel to block the light. If debris has built up the key will not go all the way down and light leakage will occur resulting in no registration of a switch depression.

In the present invention in both the embodiment of FIGS. 1-9 and embodiment of FIG. 10, when a key is depressed it does not come to rest at the bottom of the light channel. The key overtravels past the light channels. In the embodiment of FIGS. 1-9 the key overtravels into the space between the baseplate and keyboard housing. The key is constructed to be of a length that it will not contact the baseplate. In the embodiment of FIG. 9 the key overtravels and there is no base. The printed circuit board is spaced considerably below the key aperture and will not stop the key depression. The structural member under the key aperture is used for the spring retainer and will not interfere with the key overtravel. In neither embodiment will debris buildup affect the switch depression.

Another advance is use of a key with a vertical slot. This enables the key to be fabricated in a single molding operation. Additionally, the vertical slot may be molded so it will allow a certain amount of free travel to compensate for an operator keeping fingers on the keys with a slight pressure. In the preferred embodiment 3/32 of an inch of play is allowed. This compares with 3/32 of an inch travel for actuating the key. The light channel is about 3/32 of an inch deep.

A third novel feature is having the light channels set in from the edges of the key apertures. This allows a key to overlap a light channel and prevent light leakage.

What is claimed is:

1. A photo-optical keyboard comprising: a keyboard housing having a matrix of rows and column of apertures for key mounting, the underside surface of said housing having a light channel for each row passing between the apertures in each row and a light channel for each column passing between the apertures in each column, each said light channel opening up to the underside surface of said keyboard housing.

2. The apparatus of claim 1 in which each of said light channel is spaced inward a distance from the edge of a key aperture, the spacing being sufficient to allow key overlap on both sides of the light channel.

3. The apparatus of claim 1 in which the underside of said keyboard housing has light isolation barrier channels.

4. The apparatus of claim 3 in which said light isolation barrier channels are between said rows.

5. The apparatus of claim 3 further comprising a bottom plate adjacent to and spaced from the underside of said keyboard housing, said bottom plate having light isolation barriers extending from the bottom plate into said light isolation barrier channels, said bottom plate being spaced to allow key overtravel.

6. The apparatus of claim 5 in which each said light channel is spaced inward a distance from the edge of a key aperture, the spacing being sufficient to allow key overlap on both sides of the light channel.

7. The apparatus of claim 1 further comprising a bottom plate adjacent to and spaced from the underside of said keyboard housing, said bottom plate having light isolation barriers extending from said bottom plate at least to the underside surface of said keyboard housing, said bottom plate being spaced to allow key overtravel.

8. The apparatus of claim 7 further comprising:
multiple keys each shaped to said apertures, said keys having passages to allow light from said light channels to pass in the undepressed position, said key causing an interruption of light in said light channels in the depressed position, said keys each having a means to permit key overtravel but to prevent the keys from touching said bottom plate when fully depressed.

9. The apparatus of claim 8 in which each of said keys has vertical slots in its sidewalls opening up to the bottom of the key, said vertical slots allowing light to pass through said light channels when said key is not depressed and interrupting light when said key is depressed.

10. The apparatus of claim 9 in which said vertical slots are sized to allow for free travel of the key prior to activation of the key.

11. The apparatus of claim 9 in which the underside of said keyboard housing has light isolation barrier channels into which said light isolation barriers extend.

12. The apparatus of claim 11 in which each of said light channel is spaced inward a distance from the edge of a key aperture, the spacing being sufficient to allow key overlap on both sides of the light channel.

13. A photo-optical keyboard comprising: a keyboard housing having a matrix of rows and columns of apertures for key mounting, the underside surface of said housing having a light channel for each row passing between the apertures in each row, and a light channel for each column passing between the apertures in each column, each said light channel opening up at the underside surface of said keyboard housing; multiple light isolation barriers between said light channels, said barriers extending downward from the underside of said keyboard housing to prevent crossover of light between said light channels.

14. The apparatus of claim 13 in which said light isolation barriers are integral with said keyboard housing.

15. The apparatus of claim 14 having a spring retainer member operably associated with each key aperture each said spring retainer member spaced to allow overtravel of keys.

16. The apparatus of claim 15 in which each of said light channel is spaced inward a distance from the edge of a lay aperture, the spacing being sufficient to allow key overlap on both sides of the light channel.

17. The apparatus of claim 16 further comprising:
multiple keys each shaped to said apertures, said keys having passages to allow light from said light channels to pass in the undepressed position, said key causing an interruption of light in said light channels in the depressed position, said keys each having a stopping means to allow key overtravel and stop said key in the depressed position.

18. The apparatus of claim 17 in which each of said keys has vertical slots in its sidewalls opening up to the bottom of the key, said vertical slots allowing light to pass through said light channels when said key is not depressed and interrupting light when said key is depressed.

* * * * *